United States Patent [19]

Satoh et al.

[11] Patent Number: 6,165,617
[45] Date of Patent: *Dec. 26, 2000

[54] RESIN-COATED COPPER FOIL FOR MULTILAYER PRINTED WIRING BOARD AND MULTILAYER PRINTED WIRING BOARD PROVIDED WITH SAID COPPER FOIL

[75] Inventors: Tetsurou Satoh, Saitama; Hiroaki Tsuyoshi, Omiya; Nobuo Hayasaka, Ageo, all of Japan

[73] Assignee: Mitsui Mining & Smelting Co., Ltd., Japan

[ * ] Notice: This patent is subject to a terminal disclaimer.

[21] Appl. No.: 08/981,751

[22] PCT Filed: Jul. 4, 1995

[86] PCT No.: PCT/JP95/01335

§ 371 Date: Dec. 31, 1997

§ 102(e) Date: Dec. 31, 1997

[87] PCT Pub. No.: WO97/02728

PCT Pub. Date: Jan. 23, 1997

[51] Int. Cl.⁷ .......................... B32B 15/04; B32B 15/08; B32B 15/20; H05K 1/02
[52] U.S. Cl. ...................... 428/418; 428/457; 428/425.8; 428/674; 174/250; 174/256
[58] Field of Search ..................................... 428/413, 418, 428/457, 461, 423.1, 425.8, 465, 492, 901, 674, 460, 469, 472; 307/147; 174/250, 255, 256, 259

[56] References Cited

U.S. PATENT DOCUMENTS

| | | | |
|---|---|---|---|
| 3,172,921 | 3/1965 | Flowers | 260/836 |
| 3,962,520 | 6/1976 | Watanabe et al. | 428/414 |
| 4,212,912 | 7/1980 | Wartusch et al. | 428/209 |
| 4,353,954 | 10/1982 | Yamaoka et al. | 428/216 |
| 4,719,255 | 1/1988 | Yoshizumi et al. | 523/436 |
| 4,915,797 | 4/1990 | Vigezzi et al. | 204/28 |
| 4,985,294 | 1/1991 | Watanabe et al. | 428/209 |
| 5,084,124 | 1/1992 | Taniguchi | 156/315 |
| 5,153,987 | 10/1992 | Takahashi et al. | 29/852 |
| 5,162,140 | 11/1992 | Taniguchi | 428/40 |
| 5,173,150 | 12/1992 | Kanaoka et al. | 156/630 |
| 5,362,534 | 11/1994 | McKenney et al. | 428/40 |
| 5,674,611 | 10/1997 | Saida et al. | 428/344 |
| 5,800,722 | 9/1998 | Tsuyoshi et al. | 216/13 |

FOREIGN PATENT DOCUMENTS

| | | |
|---|---|---|
| 63-58997 | 3/1988 | Japan . |
| 2-58885 | 2/1990 | Japan . |
| 03296587 | 12/1991 | Japan . |
| 05255651 | 10/1993 | Japan . |
| 06128547 | 5/1994 | Japan . |
| 07106752 | 4/1995 | Japan . |
| 2 224 464 | 5/1990 | United Kingdom . |

*Primary Examiner*—John J. Zimmerman
*Assistant Examiner*—Michael LaVilla
*Attorney, Agent, or Firm*—Jenkens & Gilchrist

[57] ABSTRACT

A resin-coated copper foil for use in a multilayer printed wiring board, characterized by having on one surface thereof a resin composition comprising, based on the total amount of the resin components, 50 to 90% by weight of epoxy resins, 5 to 20% by weight of a polyvinyl acetal resin, and 0.1 to 20% by weight of an urethane resin, with the proviso that 0.5 to 40% by weight of the epoxy resins is a rubber-modified epoxy resin; and a multilayer printed wiring board using the resin-coated copper foil therein.

7 Claims, No Drawings

RESIN-COATED COPPER FOIL FOR MULTILAYER PRINTED WIRING BOARD AND MULTILAYER PRINTED WIRING BOARD PROVIDED WITH SAID COPPER FOIL

RELATED APPLICATION

This application is an application under 35 U.S.C. §371 of PCT/JP95/01335, filed Jul. 4, 1995.

TECHNICAL FIELD

The present invention relates to a resin-coated copper foil for use in a multilayer printed wiring board and a multilayer printed wiring board using the copper foil(s) therein. It is noted that the present specification illustrates a multilayer printed wiring board having 2 inner layer circuits and 2 outer layer circuit.

BACKGROUND ART

In most cases, a laminate for producing therefrom a printed wiring board used in the electronic industry is manufactured by impregnating a glass cloth, kraft paper, a glass nonwoven fabric or the like with a thermosetting resin such as phenolic resin or epoxy resin, setting the thermosetting resin semi-cured to produce a prepreg with the semi-cured resin attached thereto, and laminating a copper foil on one or each of both surfaces of the prepreg to obtain a copper-clad laminate.

Further, a multilayer printed wiring board having two inner-layer circuits and two outer-layer circuits is produced as illustrated below.

The one or two surface copper foils of the aforementioned copper-clad laminate are subjected to etching or the lie for formation of one or two inner-layer circuits to produce an inner-layer member comprising the inner-layer substrate (prepreg) and the one or two inner-layer circuits. Separately, the same prepreg as mentioned above has a copper foil attached to one or both surfaces thereof and is then subjected to etching or the like to produce an outer-layer member comprising the outer-layer substrate (prepreg) and outer-layer copper foil circuit. Two such outer-layer members sandwich said inner-layer member in therebetween, after which these three members are heated under a pressure to produce a multilayer printed wiring board having two inner-layer circuits and two outer-layer circuits.

The laminate produced by the aforementioned manufacturing method has practically satisfactory heat resistance, electrical properties and chemical resistance for use as a material or blank for a printed wiring board.

However, the use of the prepreg as described above raises problems, examples of which are an uneven surface called a "glass fiber texture" formed on the surface(s) of the laminate after pressing thereof, the lowering of insulation reliability called "migration", and a difficulty in perforating the laminate with a laser beam because of the inclusion in the prepregs, between the inner layer circuit and outer-layer circuit, of glass fibers which can not be decomposed even at a high temperature.

In attempts to overcome these problems, there have hitherto been proposed methods for producing a multilayer printed wiring board without use of any prepreg between inner-layer circuit and outer-layer circuit. "Printed Circuit World Convention VI, I9" describes a method for producing a multilayer printed wiring board with use of resin-coated copper foils respectively having a plurality of resin layers which are different in cured state and covered with a protective film. However, this method raises problems as to disadvantageously complicated production steps due to application of resin layers differing in cured state onto the surface of copper foils, troublesome peeling of the protective films and costly use of the protective film.

The inventors of the present invention have already proposed an adhesive for copper foils which is useful for laminating a copper foil on a substrate such as a metal plate or a plastics plate, and also proposed on adhesive-coated copper foil (Japanese Patent Application No. 243,430/94). The adhesive and the adhesive-coated copper foil disclosed herein are designed to adhere to a material under lower pressure and temperature than conventional ones. However, they are not intended to be used for press lamination or multilayer relamination because an insulation layer of variable thickness would result and there would be high resin flow causing excessive resin "bleed out". Another problem is a so-called "blocking phenomenon" that is adhesion between the resin surface of one copper foil and the glossy surface of another copper foil adjacent to said one copper foil when the resin-coated copper foils are stacked one upon another for storage.

Further, Japanese Patent Application No. 22,321/95 has proposed an adhesive composition to achieve the low resin flow even during the press lamination. The resin composition disclosed in the above Application comprises 20 to 50 wt/%, based on the total amount of the resin components, of a polyvinyl acetal resin thereby to control the resin flow during the course of press molding. The intention of this invention is to produce a printed wiring board while eliminating the conventional copper foil roughening step. However, there may be defects such as voids in the inner layer circuits after relamination. Furthermore, since a malamine resin is constituent of the adhesive it may be attached by etching solution during subsequent processing.

In Japanese Patent Laid-Open Gazette No. 106,752/95, the inventors of the present invention have pointed out or indicated problems which will be raised as to the use of a melamine resin as an adhesive for use in a printed wiring board. According to this specification the inclusion of melamine resin in the adhesive used to coat copper foil for printed wiring board applications results in chemical attack by copper chloride/hydrochloric acid etching solutions. This will raise a problem that copper ions remain on the surfaces of the substrate even if the etched copper foils are washed with water and these copper ions inhibit the cure of a solder resist ink applied on the surfaces of the substrate thereby lowering the adhesion of the ink to the substrate. Since the melamine resin is disclosed to be used as part of the resin composition in Japanese Patent Application No. 22,321/95 as well, it is difficult to obviate the foregoing problem.

DISCLOSURE OF THE INVENTION

An object of the present invention is to provide a resin-coated copper foil for use in a multilayer printed wiring board, in which the resin is excellently easy to handle due to its excellent blocking resistance and flexibility, and one which exhibits low resin flow during press lamination.

Another object of the present invention is to provide a multilayer printed wiring board which is excellent in etching solution resistance, relamination integrity, surface smoothness and insulation reliability and easily perforated with a laser beam.

The resin-coated copper foil of the present invention for use in a multilayer printed wiring board, which foil is indispensable to attain the above-mentioned objects, comprises on one surface thereof a resin composition comprising, based on the total amount of the resin components, 50 to 90% by weight of an epoxy resin, 5 to 20% by weight of a polyvinyl acetal resin and 0.1 to 20% by weight of a urethane resin, with the proviso that 0.5 to 40% by weight of said epoxy resin is a rubber-modified epoxy resin.

A detailed description will now be made of a resin-coated copper foil for use in a multilayer printed wiring board of the present invention.

Commercially available epoxy resins for use in forming of laminates and electronic parts can be used without any particular limitation as the epoxy resins for use in the resin composition used in the present invention. Examples of the epoxy resins are bisphenol A-type epoxy resins, bisphenol F-type epoxy resins, novolak epoxy resins, o-cresylic novolak epoxy resins, triglycidyl isocyanurate, glycidylamine compounds such as N,N-diglycidylaniline, glycidyl ester compounds such as diglycidyl tetrahydrophthalate, and brominated epoxy resins such as tetrabromobisphenol A. In addition, there can also be used so-called rubber-modified epoxy resins obtained as reaction products of a carboxyl group-containing rubber with an epoxy resin, and epoxidized polybutadiene. These epoxy resins may be used either alone or in mixture. The degree of polymerization and epoxy equivalent of each of these epoxy resins are not particularly limited.

Preferable curing agents for the epoxy resins include generally known latent curing agents such as dicyandiamide, organic hydrazides, imidazoles, and phenolic novolak resins hardly curable at ambient temperatures. The optimum amount of such a curing agent added to a particular epoxy resin is known, but the amount thereof added may arbitrarily be varied. These curing agents may be used either alone or jointly, and may preferably be used in combination with an epoxy resin curing accelerator such as a tertiary amine.

In the present invention, the epoxy resin content of the resin composition is 50 to 90% by weight of the total amount of the resin ingredients. When the content is lower than 50% by weight, the resulting printed wiring board has inferior electrical properties and heat resistance. On the other hand, when it exceeds 90% by weight, the resin layers become brittle and present handling difficulties.

The polyvinyl acetal resin for use in the resin composition used in the present invention may be a resin synthesized by the reaction of polyvinyl alcohol with an aldehyde. Reaction products of polyvinyl alcohol having a variety of degrees of polymerization with a single aldehyde or at least 2 kinds of aldehydes are now commercially available as polyvinyl acetal resins for use in coatings and adhesives. They can be used in the present invention without any particular limitation on the kind of aldehyde and the degree of acetalization. In addition, although the degree of polymerization of polyvinyl alcohol as a raw material is not particularly limited, products synthesized from polyvinyl alcohol having a polymerization degree of 1,700 to 3,500 may desirably be used in consideration of the heat resistance and solubility in a solvent of the resulting resin. Furthermore, modified polyvinyl acetal resins having carboxyl groups or the like introduced into the molecule are also commercially available and they can be used without any particularly limitation, as far as their compatibility with the epoxy resins to be used in combination is kept satisfactory.

In the present invention, the polyvinyl acetal resin content of the resin composition is 5 to 20% by weight of the total amount of the resin ingredients of the resin composition. When it is lower than 5% by weight, controlled resin flow can not be achieved. On the other hand, when it exceeds 20% by weight, relamination becomes more difficult.

The urethane resins used in the resin composition according to used the present invention may be commercially available resins containing isocyanate groups in the molecule which are useful in adhesives and coatings. The urethane resins used herein include reaction products of a polyisocyanate compound such as tolylene diisocyanate, diphenylmethane diisocyanate or polymethylenepolyphenyl polyisocyanate with a polyol such as trimethylolpropane, a polyether polyol or a polyester polyol. Since such compounds are so high in reactivity for resins that they are sometimes polymerized with water in the atmosphere, these resins may be stabilized with phenol or an oxime to form urethane resins called "blocked isocyanates" for the purpose of preferable use of said resins (highly reactive compounds) in the present invention.

In the present invention, the urethane resin content of the resin composition is 0.1 to 20% by weight based on the total amount of the resin components. When it is lower than 0.1% by weight, the resulting product will be deteriorated in blocking resistance, whereas when it exceeds 20% by weight, the adhesiveness of the resin to the copper foil will be lowered.

In the present invention, as far as commercially available rubber-modified epoxy resin products for use in adhesives and coatings can be used without any particular limitation as the rubber-modified epoxy resin which is a part of the epoxy resins contained in the resin composition. The rubber-modified epoxy resins include EPIXLON TSR-960 (trade name, manufactured by Dainippon Ink & Chemicals, Incorporated), EPOTOHTO YR-102 (trade name, manufactured by Tohto Kasei Co., Ltd.), SUMIEPOXY ESC-500 (trade name, manufactured by Sumitomo Chemical Co., Ltd.) and EPOMIK VSR 3531 (trade name, manufactured by Mitsui Petrochemical Industries, Ltd.). These rubber-modified epoxy resins may be used alone or in mixture. The rubber-modified epoxy resin content of the resin composition used in the present invention is 0.5 to 40% by weight of the total amount of the epoxy resins. Use of the rubber-modified epoxy resin remarkably improve the resin-coated copper foil in flexibility. However, when the rubber-modified epoxy resin content is lower than 0.5% by weight, the effect of improving the flexibility can not be achieved. On the other hand, when it exceeds 40% by weight, the cured resin will be lowered in heat resistance and deteriorated in blocking resistance.

Besides the foregoing indispensable components, the resin composition used in the present invention may further comprise a resin such as a polyester resin, a phenolic resin or a phenoxy resin, a nonfibrous inorganic filler represented by talc and aluminum hydroxide, a flame retardant such as antimony trioxide, and an additives such as a defoaming agent, a leveling agent and a coupling agent. They are effective in improving the resin surface smoothness and the flame retardancy of the cured products, and in reducing the cost, etc.

In the present invention, the resin composition mentioned above is dissolved in a general-purpose solvent such as toluene or methyl ethyl ketone, applied onto one surface of a copper foil, and then heated to remove the solvent and partially cure (semicure) the resins to produce a resin-coated copper foil ready for use. In this step, the kind and amount of a solvent used are not particularly limited. The copper foils for use in combination with the resin composition may be either a rolled copper foil or an electrodeposited copper foil each having a thickness of preferably 9 to 100 μm, more preferably 12 to 35 μm. The manners of roughening treatment and corrosion prevention treatment of the copper foils for use in combination with the resin composition are not particularly limited, and customary methods of such treatments can be adopted.

A multilayer printed wiring board is produced using the resin-coated copper foil produced according to the foregoing procedure. The conditions of production in this step may be the same as in the production of a multilayer printed wiring board according to the conventional lamination process. More specifically, the above mentioned resin-coated copper foil is applied to one or both surfaces of a printed and etched inner layer which has been subjected to a copper roughening treatment to enhance the bonding to the adjoining resin coated surfaces of the foil during the next relamination step. The resulting laminate is then subjected to etching formation of outer layer circuits, perforation, plating up etc. to obtain a finished multilayer printed wiring board.

EXAMPLES

The present invention will be better understood by the following Examples and Comparison Examples.

Example 1
(Preparation of Resin-Coated Copper Foil)

Sixth (60) parts by weight of a bisphenol A-type epoxy resin (trade name: EPOMIK R-301, manufactured by Mitsui Petrochemical Industries, Ltd.), 20 parts by weight (corresponding to 25% by weight of all the epoxy resins) of a rubber-modified epoxy resin (trade name: PEOTOHTO YR-102, manufactured by Tohto Kasei Co., Ltd.), 10 parts by weight of a polyvinyl acetal resin (trade name: DENKA BUTYRAL 5000A, manufactured by Denki Kagaku Kogyo Kabushiki Kaisha), 10 parts by weight of a urethane resin (trade name: CORONATE AP-Stable, manufactured by Nippon Polyurethane Industry Co., Ltd.), 2 parts by weight of dicyandiamide (reagent) as an epoxy resin curing agent (added in the form of a dimethylformamide solution thereof having a solid content of 25%), and 0.5 parts by weight of a curing accelerator (trade name: CUREZOL 2E4MZ, manufactured by Shikoku Chemicals Corp.) were dissolved in methyl ethyl ketone to prepare a resin composition having a solids content of 45%.

The resin composition so prepared was applied onto the roughened surface of an electrodeposited copper foil having a thickness of 18 μm, dried with air, and then heated at 150° C. for 7 minutes to obtain a semicured resin-coated copper foil, the thickness of the resin layer of which was 100 μm.

(Production of Multilayer Printed Wiring Board)
(1) Production of Inner-Layer Member An electrodeposited copper foil having had one surface thereof subjected to roughening treatment and having a thickness of 35 μm was laminated on each of the surfaces of an inner-layer substrate comprising 8 sheets of a commercially available 0.1 mm-thick glass-epoxy prepreg in such a way as to make the roughened surface of the foil contact with the prepreg (inner layer substrate), and then pressed together for at a pressure of 30 kgf/cm$^2$ and a temperature of 170° C. for 60 minutes to produce a double-faced copper-clad laminate wherein both surfaces of the prepreg were each covered with a copper foil. Both surfaces of this laminate were subjected to etching or the like to form inner-layer circuits.

(2) Production of Multilayer Printed Wiring Board

Both etched surfaces of the inner layer member produced in (1) above were washed in pure water and dried. Thereafter, 2 pieces of the resin-coated copper foil produced according to the aforementioned procedure were laminated respectively on the surfaces of the inner-layer member in such a way as to make the resin layers of the resin-coated copper foils contact respectively with the inner-layer member, pressed together at a pressure of 30 kgf/cm$^2$ and a temperature of 170° C. for 60 minutes, and then subjected to etching or the like for formation of outer-layer circuits thereby to produce a multilayer printed wiring board with 4-layer circuits (2 inner-layer circuits and 2 outer-layer circuits).

Example 2

Seventy (70) parts by weight (in terms of solid content) of a brominated epoxy resin (trade name: D.E.R. 514-EK80, manufactured by Dow Chemical Japan Limited), 10 parts by weight of an o-cresylic novolak epoxy resin (trade name: EOCN-104S, manufactured by Nippon Kayaku Co., Ltd.), 10 parts by weight (corresponding to 12.5 wt. % of all the epoxy resins) of a rubber-modified epoxy resin (trade name: EPOMIK VSR3531, manufactured by Mitsui Petrochemical Industries, Ltd.), 5 parts by weight of a polyvinyl acetal resin (trade name: DENKA BUTYRAL 6000CG, manufactured by Denki Kagaku Kogyo Kabushiki Kaisha), 5 parts by weight of a urethane resin (trade name: DESOMOPHENE CT-Stable, manufactured by Sumitomo Bayer Urethane Co., Ltd.), 2 parts by weight of dicyandiamide (reagent) as a curing agent for the epoxy resins (added in the form of a dimethylformamide solution of the curing agent having a solid content of 25%), and 0.5 parts by weight of a curing accelerator (trade name: CUREZOL 2E4MZ, manufactured by Shikoku Chemicals Corp.) were dissolved in methyl ethyl ketone to prepare a resin composition having a solids content of 50%.

The resin composition so prepared was applied onto the roughened surface of a commercially available electrodeposited copper foil having a thickness of 18 μm, dried with air and then heated at 150° C. for 7 minutes to produce a semicured resin-coated copper foil, the thickness of the resin layer of which was 100 μm. A multilayer printed wiring board comprising 4-layer circuits (2 inner-layer circuits and 2 outer-layer circuits) was produced according to substantially the same procedure as in Example 1.

Comparative Example 1

A resin composition having a solids content of 45% was prepared in substantially the same manner as in Example 1 except that a melamine resin (trade name: U-VAN 20SB, manufactured by Mitsui Toatsu Chemicals, Inc.) was used instead of the urethane resin (trade name: CORONATE AP-Stable, manufactured by Nippon Polyurethane Industry Co., Ltd.) used in Example 1.

The resin composition so prepared was coated on an 18 μm-thick copper foil to form a 100 μm-thick resin layer on the copper foil. Further, this resin-coated copper foil was used in substantially the same manner as in Example 1 to produce a multilayer printed wiring board comprising 4-layer circuits (2 inner-layer circuits and 2 outer-layer circuits).

Comparative Example 2

A resin composition was prepared in substantially the same manner as in Example 1 except that 25 parts by weight of a polyvinyl acetal resin (trade name: DENKA BUTYRAL 6000CG, manufacture by Denki Kagaku Kogyo Kabushiki Kaisha) having a solid content of 35% was substituted for 10 parts by weight of the resin having a solid content of 45% used in Example 1.

The resin composition so prepared was coated on an 18 μm-thick copper foil to form a 100 μm-thick resin layer thereon. Further, this resin coated copper foil was used in substantially the same manner as in Example 1 to produce a multilayer printed wiring board comprising 4-layer circuits (2 inner-layer circuits and 2 outer-layer circuits).

Comparative Example 3

Seventy-seven (77) parts by weight (in terms of solid content) of a brominated epoxy resin (trade name: D.E.R. 514-EK80, manufactured by Dow Chemical Japan Limited), 15 parts by weight of an o-cresylic novolak epoxy resin (trade name: EOCN-104S, manufactured by Nippon Kayaku Co., Ltd.), 3 parts by weight of a polyvinyl acetal resin (trade name: DENKA BUTYRAL 6000CG, manufactured by Denki Kagaku Kogyo Kabushiki Kaisha), 2 parts by weight of dicyandiamide (reagent) as an epoxy resin curing agent (added in the form of a dimethylformamide solution thereof having a solid content of 25%), and 0.5 parts by weight of a curing accelerator (CUREZOL 2E4MZ, manufactured by Shikoku Chemicals Corp.) were dissolved in methyl ethyl ketone to prepare a resin composition having a solid content of 60%.

The resin composition so prepared was applied onto the roughened surface of a commercially available electrode-posited copper foil having a thickness of 35 μm, dried with air, and then heated at 150° C. for 7 minutes to produce a resin-coated copper foil having a 100 μm-thick resin layer. A multilayer printed wiring board comprising 4-layer circuits (2 inner-layer circuits and 2 outer-layer circuits) was produced according to substantially the same procedure as in Example 1.

The resin-coated copper foils and multilayer printed wiring boards produced in Examples 1 and 2 and Comparative Examples 1 to 3 were evaluated for the following items. The results are shown in Tables 1 and 2.

(Resin-Coated Copper Foil)

(1) Blocking Resistance:

A 35 μm-thick electrolytic copper foil was cut into 10 cm×10 cm was pieces, while the present and comparative resin-coated copper foils were each cut into pieces of the some size as above. The piece of the resin-coated copper foil was superimposed on the piece of the resin-free copper foil with the resin surface of the former contacting with the glossy surface of the latter. These pieces were then kept under a load of 500 g for 48 hours in a thermohumidstat (oven) set at a temperature of 30° C. and a humidity of 40%, after which they were withdrawn from the oven to judge whether or not the resin surface was adhered to the glossy surface.

◯: not adhered x: adhered (2) Flexibility: according to JIS K 5400, diameter of stem: 2 mm ◯: not cracked x: cracked (Multilayer Printed Wiring Board)

(1) Peel Strength in Ordinary State: 10 mm wide, according to JIS C 6481

(2) Peel Strength after Soldering Treatment: 10 mm wide, according to JIS C 6481

(3) Soldering Heat Resistance: according to JIS C 6481

(4) Relamination of Inner Layer Circuits: After removal of the whole outer-layer copper foil by etching, whether or not there is a relamination defect such as a void is visually judged.

◯: good x: poor (5) Thickness of Insulating Layer: The thicknesses of the resin layer before and after pressing were actually measured.

(6) Etching Solution Resistance: After removal of the whole outer-layer copper foil by etching and washing of the etched portion with water, whether or not any copper remained on the surface of the substrate was measured according to EPMA analysis.

◯: no copper detected x: copper detected

TABLE 1

Properties of Resin-Coated Copper Foil

| Ex. & Comp. Ex. | Blocking Resistance | Flexibility |
| --- | --- | --- |
| Ex. 1 | ◯ | ◯ |
| Ex. 2 | ◯ | ◯ |
| Comp. Ex. 1 | x | ◯ |
| Comp. Ex. 2 | ◯ | ◯ |
| Comp. Ex. 3 | ◯ | x |

TABLE 2

Properties of Multilayer Printed Wiring Board

| Ex. and Comp. Ex. | Peel Strength in Ordinary State/ after Soldering (kgf/cm) | Soldering Heat Resistance (sec) | Re-lamination of Inner Layer Circuits | Thickness of Insulating Layer before Pressing/ after Pressing (μm) | Etching Solution Resistance |
| --- | --- | --- | --- | --- | --- |
| Ex. 1 | 1.35/1.30 | 120< | ◯ | 100/95 | ◯ |
| Ex. 2 | 1.41/1.41 | 120< | ◯ | 100/90 | ◯ |
| Comp.Ex.1 | 1.32/1.20 | 120< | x | 100/95 | x |
| Comp.Ex.2 | 1.45/1.44 | 120< | x | 100/95 | ◯ |
| Comp.Ex.3 | 1.48/1.41 | 120< | ◯ | 100/60 | ◯ |

As is apparent from the results in Tables 1 and 2, Examples 1 and 2 showed at least comparable or superior properties to those of Comparative Examples 1 to 3 in all the tests.

[Industrial Applicability]

The resin-coated copper foil of the present invention for use in a multilayer printed wiring board is excellent in handleability owing to excellent blocking resistance and flexibility, and shows low resin flow during the process of press lamination. Furthermore, the multilayer printed wiring board of the present invention using this resin-coated copper foil therein is excellent in etching solution resistance, relamination integrity, surface smoothness and insulation reliability, and easily perforated with a laser beam.

What is claimed is:

1. A resin-coated copper foil for use in a multilayer printed wiring board, which is characterized by having on one surface thereof a composition comprising resins, wherein the resins include 60 to 90% by weight of said resins of epoxy resins, 5 to 10% by weight of said resins of a polyvinyl acetal resin and 0.1 to 20% by weight of said resins of a urethane resin, with the proviso that 0.5 to 40% by weight of the total amount of the epoxy resins is a rubber-modified epoxy resin, with the composition being on a roughened surface of the copper foil.

2. A resin-coated copper foil for use in a multilayer printed wiring board as claimed in claim 1, wherein said resin composition is in a semicured state.

3. A multilayer printed wiring board comprising a resin-coated copper foil as claimed in claim 1 or 2.

4. A resin-coated copper foil of claim 1, wherein said composition further comprises a resin selected from the group consisting of a polyester resin, a phenolic resin, and a phenoxy resin.

5. A resin-coated copper foil of claim 1, wherein said composition further comprises a non-fibrous inorganic filler selected from the group consisting of talc and aluminum hydroxide.

6. A resin-coated copper foil of claim 1, wherein said composition further comprises antimony trioxide as a flame retardant.

7. A resin-coated copper foil of claim 1, wherein said composition further comprises an additive selected from the group consisting of a defoaming agent, a leveling agent, and a coupling agent.

\* \* \* \* \*